(12) United States Patent
Miura et al.

(10) Patent No.: US 9,583,318 B2
(45) Date of Patent: Feb. 28, 2017

(54) PLASMA PROCESSING APPARATUS, PLASMA PROCESSING METHOD, AND RECORDING MEDIUM

(71) Applicant: TOKYO ELECTRON LIMITED, Tokyo (JP)

(72) Inventors: Shigehiro Miura, Oshu (JP); Takeshi Kobayashi, Oshu (JP); Katsuaki Sugawara, Oshu (JP); Naohide Ito, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/080,822

(22) Filed: Mar. 25, 2016

(65) Prior Publication Data

US 2016/0293390 A1  Oct. 6, 2016

(30) Foreign Application Priority Data

Mar. 30, 2015 (JP) .................................. 2015-069570

(51) Int. Cl.
  *H01L 21/67* (2006.01)
  *H01J 37/32* (2006.01)
  (Continued)

(52) U.S. Cl.
  CPC .... *H01J 37/32972* (2013.01); *C23C 16/4584* (2013.01); *C23C 16/4586* (2013.01);
  (Continued)

(58) Field of Classification Search
  CPC ......... H01L 21/67109; H01L 21/67248; H01L 21/0262; H01L 21/02274; H01J 37/321;
  (Continued)

(56) References Cited

U.S. PATENT DOCUMENTS 5,989,929 A * 11/1999 Nikoh .................... H01J 37/321
                                                                    156/345.24
8,137,465 B1 * 3/2012 Shrinivasan ............ C23C 16/56
                                                                    118/719

(Continued)

FOREIGN PATENT DOCUMENTS

JP      2011-086601 A     4/2011

*Primary Examiner* — Jaehwan Oh
(74) *Attorney, Agent, or Firm* — Nath, Goldberg & Meyer; Jerald L. Meyer

(57) ABSTRACT

There is provided an apparatus of performing a plasma process on substrates mounted on an upper surface of a rotary table. The apparatus includes: a heater for heating the substrates; a process gas supply part for supplying a process gas toward the upper surface of the rotary table; an antenna for generating an inductively coupled plasma by converting the process gas to plasma; a light detection part for detecting respective light intensities of R, G and B component as light color components; a calculation part for obtaining an evaluation value corresponding to a change amount before and after supplying a high-frequency power to the antenna, with respect to at least one of the respective light intensities; and an ignition determination part for comparing the evaluation value with a threshold value and to determine that ignition of plasma is not generated if the evaluation value does not exceed the threshold value.

7 Claims, 11 Drawing Sheets

(51) Int. Cl.
*C23C 16/458* (2006.01)
*C23C 16/52* (2006.01)
*C23C 16/50* (2006.01)
*H01L 21/687* (2006.01)

(52) U.S. Cl.
CPC .............. C23C 16/50 (2013.01); C23C 16/52 (2013.01); H01J 37/321 (2013.01); H01J 37/32935 (2013.01); H01L 21/67115 (2013.01); H01L 21/68764 (2013.01); H01L 21/68771 (2013.01)

(58) Field of Classification Search
CPC ............. H01J 37/32972; H01J 37/3299; H01J 37/32917
See application file for complete search history.

(56)  References Cited

U.S. PATENT DOCUMENTS

| | | | |
|---|---|---|---|
| 2004/0023513 A1* | 2/2004 | Aoyama | ............... C23C 16/452 438/778 |
| 2009/0308840 A1* | 12/2009 | Kohno | ................ C23C 16/4405 216/37 |
| 2011/0263050 A1* | 10/2011 | Cruse | ................ H01L 21/67069 438/7 |
| 2014/0024200 A1* | 1/2014 | Kato | ................. H01J 37/32733 438/473 |
| 2016/0177449 A1* | 6/2016 | Ohmori | ............ H01J 37/32917 427/572 |

* cited by examiner

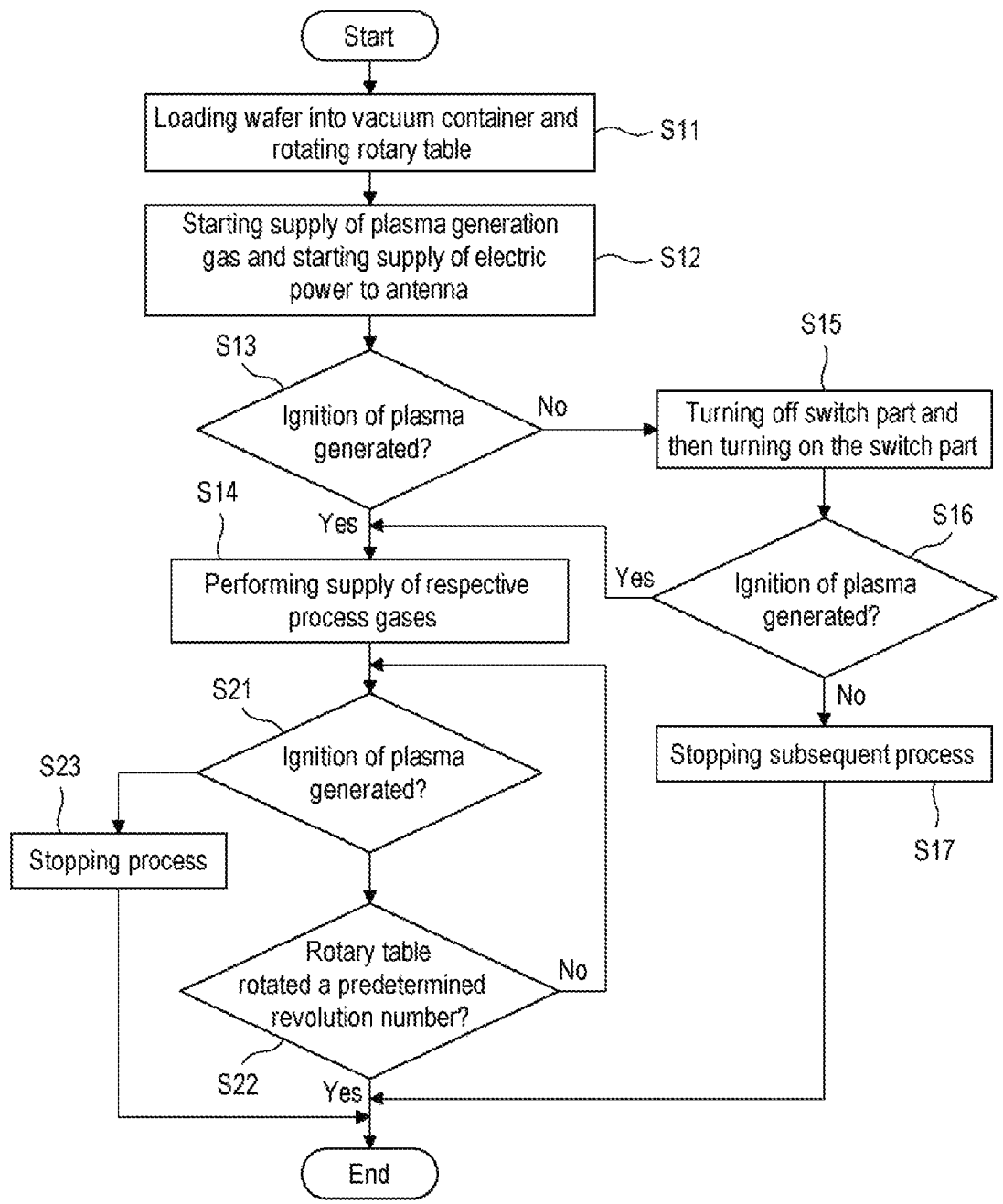

PLASMA PROCESSING APPARATUS, PLASMA PROCESSING METHOD, AND RECORDING MEDIUM

CROSS-REFERENCE TO RELATED APPLICATION

This application claims the benefit of Japanese Patent Application No. 2015-069570, filed on Mar. 30, 2015, in the Japan Patent Office, the disclosure of which is incorporated herein in its entirety by reference.

TECHNICAL FIELD

The present disclosure relates to a technique of determining an ignition or non-ignition of plasma when processing a substrate with plasma.

BACKGROUND

As an apparatus for forming a thin film, for example, a silicon oxide film ($SiO_2$), on a substrate such as a semiconductor wafer (hereinafter, referred to as a "wafer") or the like, there is known so-called a mini-batch-type film forming apparatus which performs a film forming process on a plurality of substrates mounted on a rotary table along a circumferential direction. In this film forming apparatus, for example, the rotary table is made of quartz. The substrates are heated by a heater disposed below the rotary table. By rotating the rotary table, the substrates sequentially pass through a raw material gas adsorption region, a reaction gas supply region and a plasma-based modifying region. Thus, thin films are formed on the substrates by so-called an atomic layer deposition (ALD) method and are modified by plasma.

Examples of a gas for generating plasma include an easy-to-ignite argon (Ar) gas. There may be a case where plasma is not ignited due to delicate state fluctuations such as variations in a concentration distribution of the Ar gas, a flow of the Ar gas and an electric power supplied to the semiconductor wafer. If the rotary table is rotated and the film forming process is performed without igniting plasma, it is impossible to perform plasma modification. Thus, the consumed processing time is wasted. In the meantime, the light coming from a heater passes through the rotary table. Therefore, a plasma generation region remains bright even when plasma is not generated in the plasma generation region. For that reason, if a worker is responsible for the confirmation of the plasma ignition, it is difficult for the worker to confirm the ignition or non-ignition of plasma. Thus, the worker feels burdensome.

In addition, there is known a plasma-based substrate etching apparatus which uses a technique of monitoring the emission of plasma and detecting an abnormality in the emission of plasma based on a value corresponding to a difference between a maximum value and a minimum value of color components R, G and B on the basis of a brightness signal corresponding to a predetermined state of plasma. However, such a technique cannot solve the problem addressed in the present disclosure.

SUMMARY

Some embodiments of the present disclosure provide a technique which is capable of reliably detecting an ignition of plasma in a plasma generation region kept bright by light of a heater, in an apparatus of performing a plasma process on substrates which are being revolved with a rotary table.

According to one embodiment of the present disclosure, there is provided a plasma processing apparatus of performing a plasma process with respect to substrates which are mounted on an upper surface of a rotary table installed within a vacuum container, while rotating the rotary table and consequently revolving the substrates. The apparatus includes: a heater installed under the rotary table and configured to heat the substrates; a process gas supply part configured to supply a process gas toward the upper surface of the rotary table; an antenna configured to generate an inductively coupled plasma by converting the process gas to plasma; a light detection part configured to detect respective light intensities of an R component, a G component and a B component as light color components in a plasma generation region; a calculation part configured to obtain an evaluation value corresponding to a change amount before and after supplying a high-frequency power to the antenna, with respect to at least one of the respective light intensities of the R component, the G component and the B component detected by the light detection part; and an ignition determination part configured to compare the evaluation value obtained at the calculation part with a threshold value and to determine that ignition of plasma is not generated if the evaluation value does not exceed the threshold value, wherein the rotary table is made of a material which transmits light generated by the heater.

According to another embodiment of the present disclosure, there is provided a plasma processing method, including: mounting substrates on an upper surface of a rotary table installed within a vacuum container and revolving the substrates by rotating the rotary table; heating the substrates by a heater installed under the rotary table; supplying a process gas toward one surface of the rotary table; supplying a high-frequency power to an antenna in order to generate an inductively coupled plasma by converting the process gas to plasma; detecting respective light intensities of an R component, a G component and a B component as light color components in a plasma generation region; obtaining an evaluation value corresponding to a change amount before and after the supply of the high-frequency power to the antenna, with respect to at least one of the detected respective light intensities of the R component, the G component and the B component; and comparing the obtained evaluation value with a threshold value and determining that ignition of plasma is not generated if the evaluation value does not exceed the threshold value, wherein the rotary table is made of a material which transmits light generated by the heater.

According to yet another embodiment of the present disclosure, there is provided a non-transitory computer-readable recording medium storing a computer program used in a plasma processing apparatus of performing a plasma process with respect to substrates which are mounted on an upper surface of a rotary table installed within a vacuum container while rotating the rotary table and consequently revolving the substrates, the computer program including instructions organized to perform the aforementioned plasma processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 11 is a flowchart illustrating another example of a sequence of plasma processing performed in the plasma processing apparatus.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
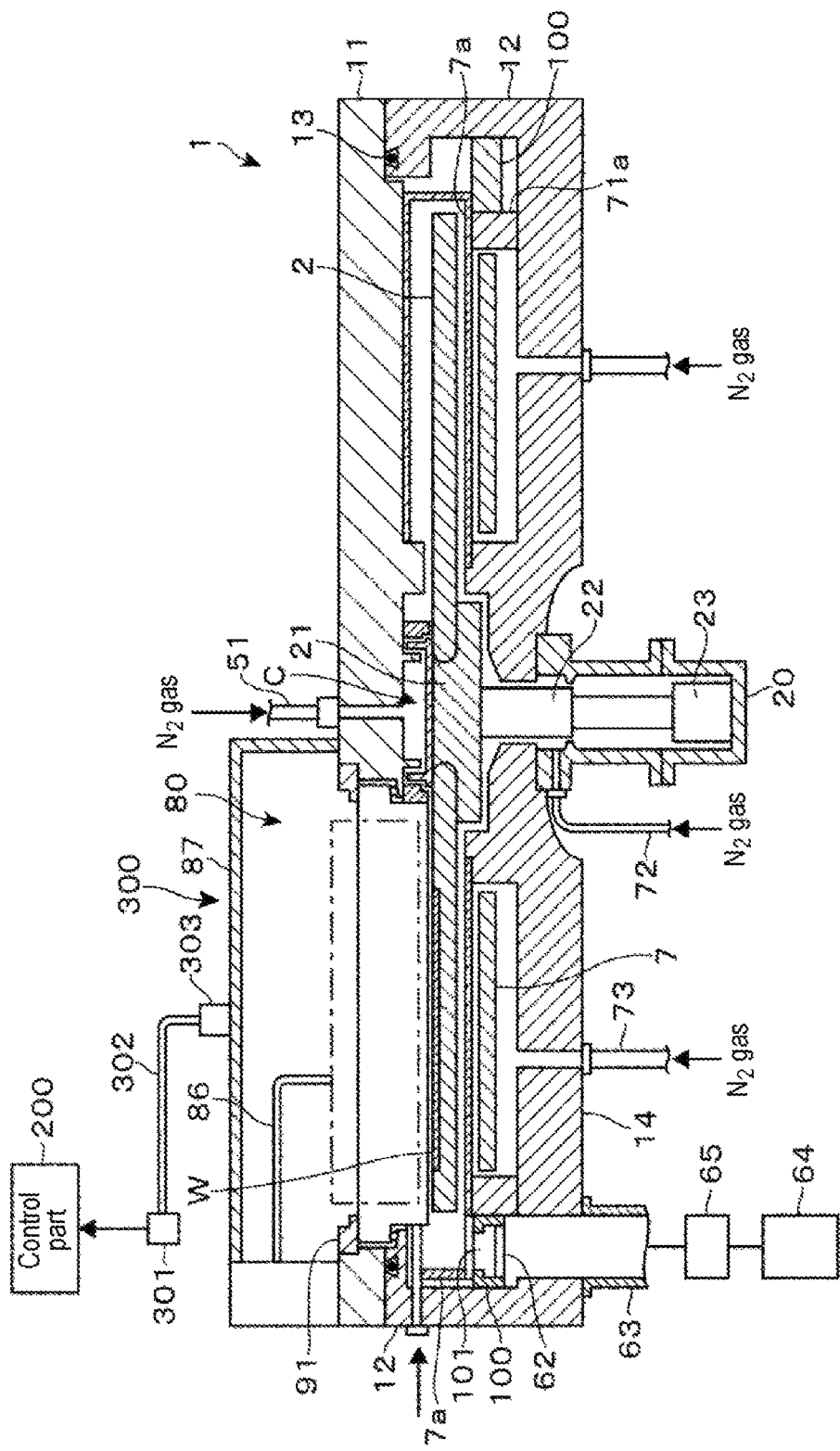
FIG. 1 is a vertical sectional view illustrating one example of a plasma processing apparatus according to an embodiment of the present disclosure.

A plasma processing apparatus according to an embodiment of the present disclosure will be described with reference to FIGS. 1 to 4. The plasma processing apparatus, which includes a vacuum container 1 and a rotary table 2 configured to rotate about a vertical axis within the vacuum container 1, is configured to perform a plasma-based film forming process with respect to wafers W used as workpieces. The vacuum container 1 includes a container body 12 and a top plate 11 detachably attached to the container body 12. A separation gas supply pipe 51 for supplying a nitrogen ($N_2$) gas as a separation gas to a central region C of the vacuum container 1 is connected to a central portion of an upper surface of the top plate 11. In FIG. 1, a reference numeral 13 designates a seal member, for example, an O-ring, which is annularly installed in a peripheral edge portion of an upper surface of the container body 12.

As illustrated in FIG. 1, a heater unit 7 as a heating mechanism is installed above a bottom surface portion 14 of the vacuum container 1 and is configured to heat the wafers W mounted on the rotary table 2 to a film formation temperature through the rotary table 2. The heater unit 7 is configured such that the temperature of the heater unit 7 is increased by, for example, supplying an electric power to a carbon wire. In FIG. 1, a reference numeral 71a designates a cover member installed at a lateral side of the heater unit 7 and a reference numeral 7a designates a covering member disposed in a substantially box shape so as to cover the periphery of the rotary table 2. Furthermore, in FIG. 1, a reference numeral 73 designates a purge gas supply pipe for supplying a nitrogen gas as a purge gas from a lower side of the heater unit 7.

The rotary table 2 is fixed to a substantially-cylindrical core portion 21 at the central portion of the rotary table 2 and is configured to be rotated about a vertical axis, clockwise in this embodiment, by a rotary shaft 22. In this embodiment, the rotary table 2 is made of quartz. In FIG. 1, a reference numeral 23 designates a drive part (rotating mechanism) configured to rotate the rotary shaft 22 about the vertical axis and a reference numeral 20 designates a case body configured to accommodate the rotary shaft 22 and the drive part 23. A purge gas supply pipe 72 for supplying a nitrogen gas to a region below the rotary table 2 is connected to the case body 20.

Figure 2:
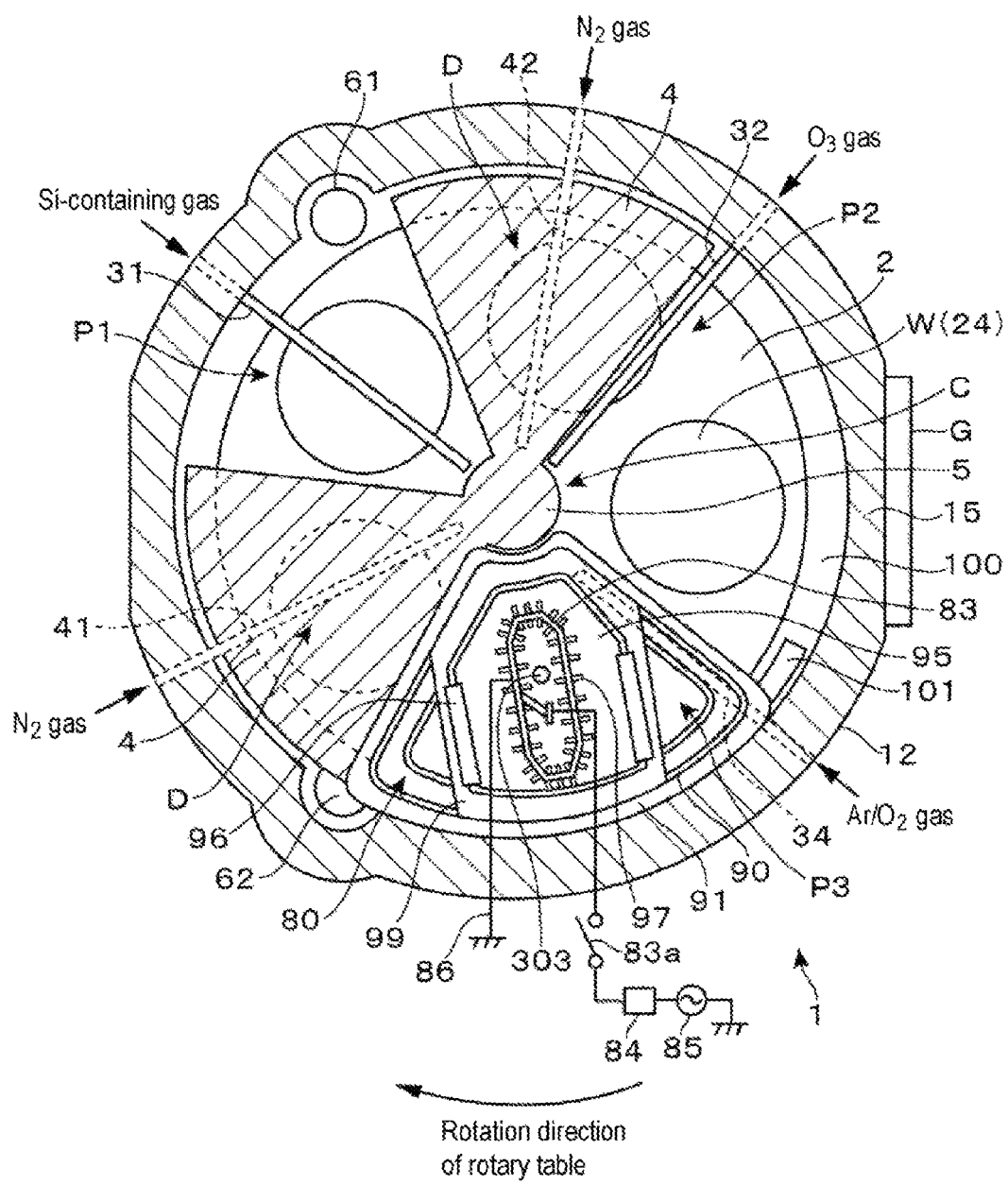
FIG. 2 is a transverse plan view illustrating the plasma processing apparatus.

As illustrated in FIG. 2, a plurality of recess portions 24, in which the wafers W are held, are formed as substrate mounting regions in the surface of the rotary table 2. The recess portions 24 are formed at a plurality of points, for example, five points, along a circumferential direction. In upper positions respectively facing regions through which the recess portions 24 pass, five nozzles 31, 32, 34, 41 and 42 are radially disposed in a mutually spaced-apart relationship along the circumferential direction of the vacuum container 1. In this embodiment, a plasma generation gas nozzle 34, a separation gas nozzle 41, a first process gas nozzle 31, a separation gas nozzle 42 and a second process gas nozzle 32 are disposed in the named order along a clockwise direction when viewed from a transfer port 15 (which will be described later). The first process gas nozzle 31 constitutes a first process gas supply part. The second process gas nozzle 32 constitutes a second process gas supply part. The plasma generation gas nozzle 34 constitutes a plasma generation gas supply part. A plasma generation gas may be a process gas used in performing a plasma process. Each of the separation gas nozzles 41 and 42 constitutes a separation gas supply part.

The first process gas nozzle 31 is connected to a supply source of a first process gas including silicon (Si), for example, a bis(tertiary-butylamino)silane (BTBAS) gas. The second process gas nozzle 32 is connected to a supply source of a second process gas including oxygen (O), for example, an ozone ($O_3$) gas. The plasma generation gas nozzle 34 is connected to a supply source of an oxygen gas and a supply source of a plasma generation gas (e.g., an argon (Ar) gas) so that the plasma generation gas nozzle 34 can supply the oxygen gas and the plasma generation gas. The separation gas nozzles 41 and 42 are respectively connected to a supply source of a nitrogen gas. Gas injection holes (not shown) are formed in, for example, a lower surface of each of the gas nozzles 31, 32, 34, 41 and 42.

The region below the first process gas nozzle 31 is defined as a first processing region P1 in which the first process gas is adsorbed onto the wafer W, and the region below the second process gas nozzle 32 is defined as a second processing region P2 in which a component of the first process gas adsorbed onto the wafer W reacts with the second process gas to produce a reaction product. The region below the plasma generation gas nozzle 34 is defined as a third processing region P3 in which the reaction product is modified with plasma. The separation gas nozzles 41 and 42 are provided to form separation regions D which separate the first processing region P1, the second processing region P2 and the third processing region P3 from one another. As illustrated in FIG. 2, protrusion portions 4 having a substantially fan-like shape are formed in the top plate 11 of the vacuum container 1 in the separation regions D. The separation gas nozzles 41 and 42 are accommodated within the protrusion portions 4.

An annular side ring 100 is disposed at a position below the rotary table 2 in an outer peripheral side of the rotary table 2. In an upper surface of the side ring 100, exhaust ports 61 and 62 are formed at two points in a mutually spaced-apart relationship along a circumferential direction. One and the other of the two exhaust ports 61 and 62 are referred to as a first exhaust port 61 and a second exhaust port 62, respectively. The first exhaust port 61 is formed between the first process gas nozzle 31 and the separation region D defined at the downstream side of the first process gas nozzle 31 in the rotation direction of the rotary table 2. The second exhaust port 62 is formed between the second process gas nozzle 32 and the separation region D defined at the downstream side of the second process gas nozzle 32 in the rotation direction of the rotary table 2.

A groove-shaped gas flow path 101 through which a gas flows toward the second exhaust port 62 while avoiding a housing 90 (which will be described later) is formed on the upper surface of the side ring 100 at a position where the housing 90 is disposed. As illustrated in FIG. 1, the first exhaust port 61 and the second exhaust port 62 are respectively coupled to a vacuum exhaust mechanism (e.g., a vacuum pump 64) via an exhaust pipe 63 in which a pressure regulation part 65 such as a butterfly valve or the like is installed.

As illustrated in FIG. 2, the transfer port 15 through which the wafers W are transferred between an external transfer arm (not shown) and the rotary table 2 is formed in the sidewall of the vacuum container 1. The transfer port 15 is configured to be air-tightly opened and closed by a gate valve G. Lift pins (not shown) inserted into through-holes formed in the rotary table 2 and configured to lift up each of the wafers W from the rear surface side thereof are installed under the rotary table 2 at a position facing the transfer port 15.

Figure 3:
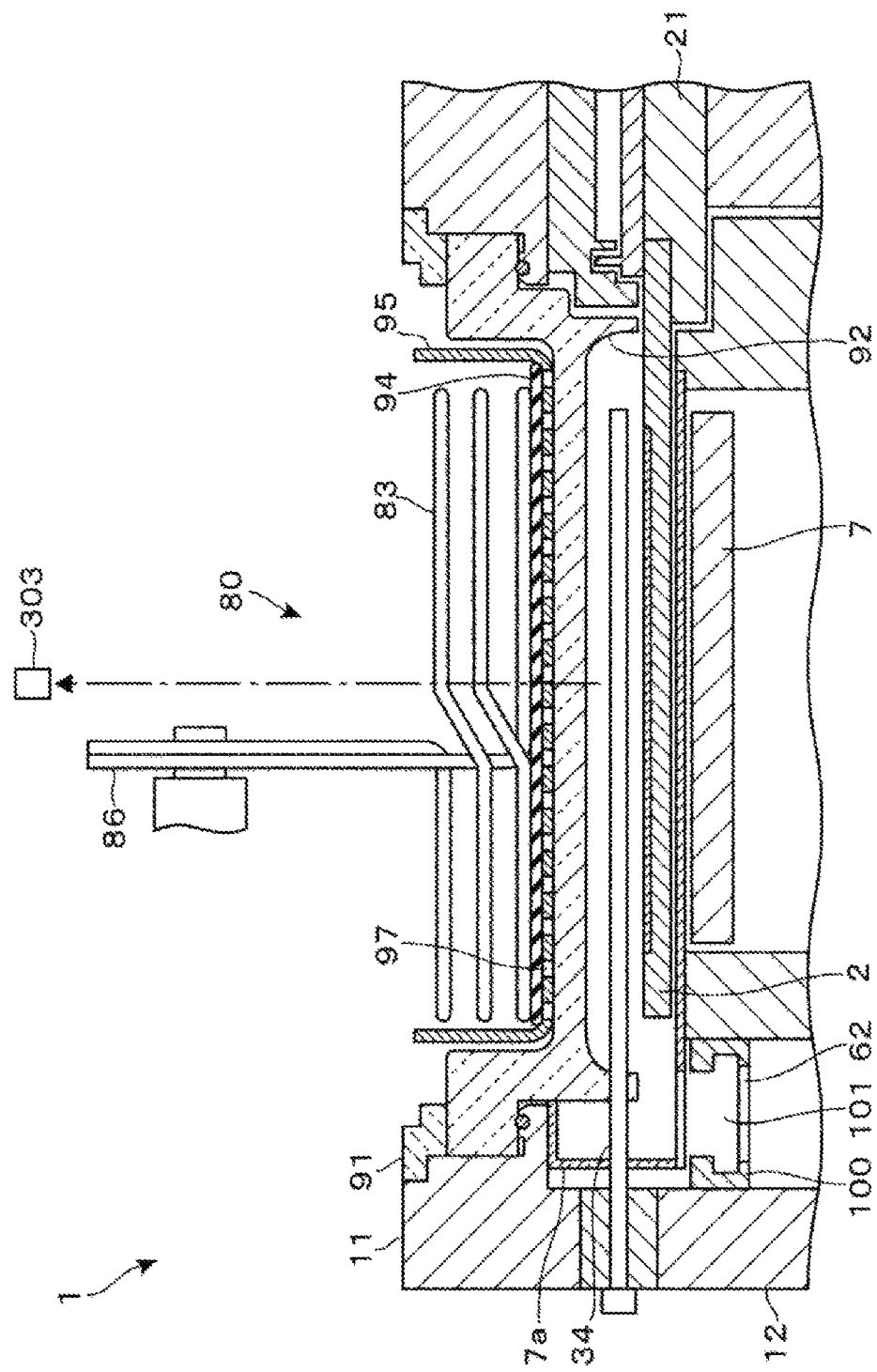
FIG. 3 is a partially-enlarged vertical sectional view of the plasma processing apparatus.
Figure 4:
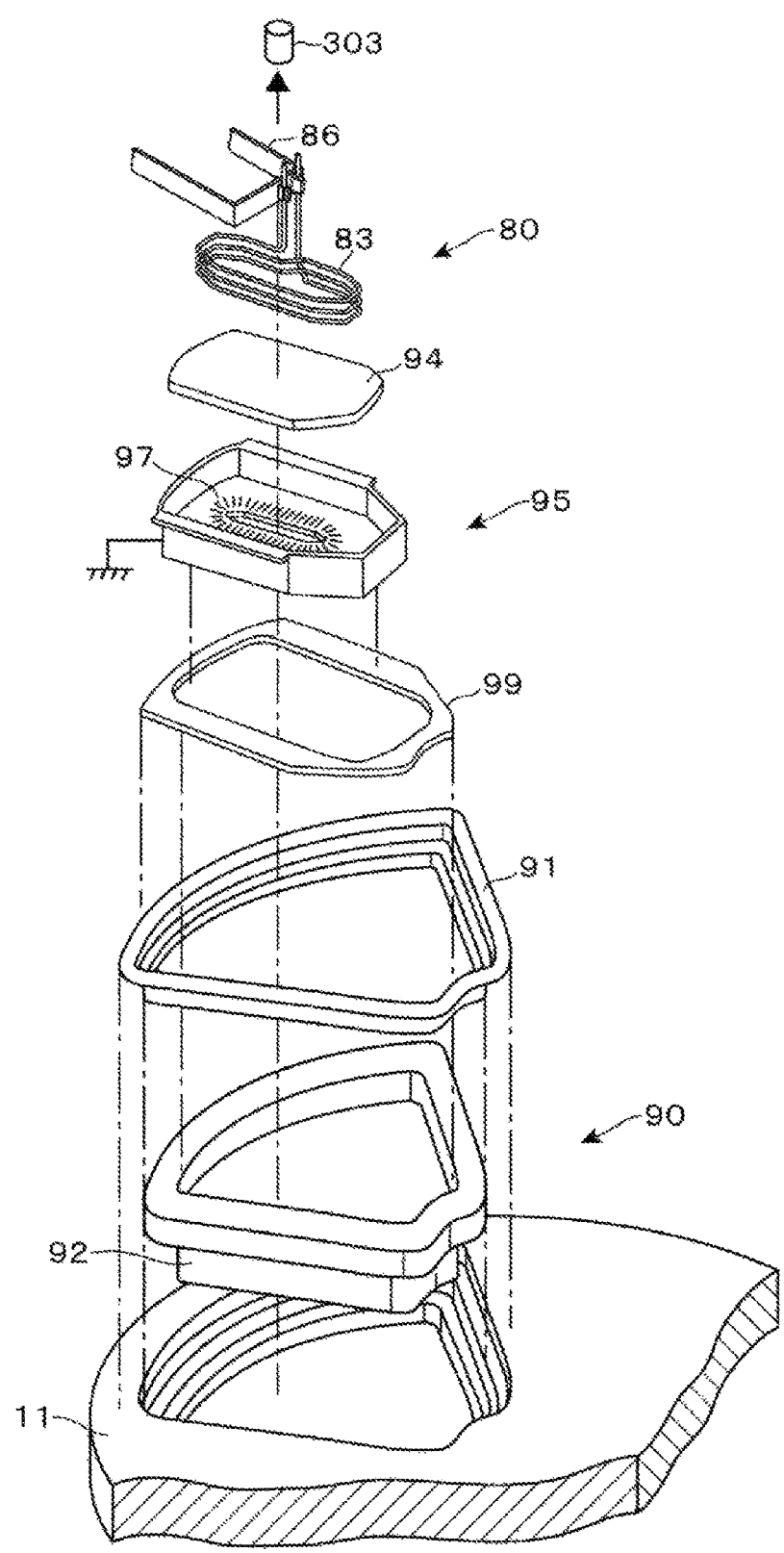
FIG. 4 is a partial exploded perspective view of the plasma processing apparatus.

Next, a plasma processing part 80 will be described. As illustrated in FIGS. 2 to 4, the plasma processing part 80 is configured by winding an antenna 83 formed of a metal wire into a coil shape. In a plan view, the plasma processing part 80 is disposed over the regions through which the wafers W pass while extending from the center side of the rotary table 2 to the outer peripheral side thereof. As illustrated in FIG. 2, the antenna 83 is coupled to a high-frequency power source 85 having a frequency of, for example, 13.56 MHz and an output power of, for example, 5,000 W via a matcher 84. The antenna 83 is configured to generate plasma of an inductively coupled plasma (ICP) mode in a plasma generation region defined under the antenna 83. In FIG. 2, a reference numeral 83a designates a switch part installed between the antenna 83 and the high-frequency power source 85.

The antenna 83 is disposed so as to be air-tightly isolated from an internal region of the vacuum container 1. Specifically, at the upper side of the plasma generation gas nozzle 34 described above, the top plate 11 is opened into a substantially fan-like shape in a plan view. The opening of the top plate 11 is air-tightly sealed by the housing 90 made of, for example, quartz. An upper peripheral portion of the housing 90 horizontally extends in a flange-like shape over a circumferential direction, and the central portion of the housing 90 is formed to be depressed toward the internal region of the vacuum container 1. The antenna 83 is accommodated inside the housing 90. In FIG. 1, a reference numeral 91 designates a pressing member for pressing the peripheral portion of the housing 90 downward. In FIG. 1, a reference numeral 86 designates a connection electrode for electrically connecting the plasma processing part 80 to the matcher 84 and the high-frequency power source 85. In FIG. 1, a reference numeral 87 designates a cover member configured to cover the upper side of the antenna 83 and the housing 90. The cover member 87 is not illustrated in the views other than FIG. 1.

In order to prevent a nitrogen gas or an ozone gas from infiltrating into a region defined below the housing 90, as illustrated in FIGS. 3 and 4, an outer peripheral portion of a lower surface of the housing 90 vertically extends downward (toward the rotary table 2) over the circumferential direction, thereby forming a gas-restricting projection portion (partition member) 92. The plasma generation gas nozzle 34 described above is accommodated in a region which is surrounded by an inner peripheral surface of the projection portion 92, the lower surface of the housing 90 and the upper surface of the rotary table 2.

As illustrated in FIGS. 3 and 4, a Faraday shield 95 opened at an upper surface side thereof and formed in a substantially box-like shape is disposed between the housing 90 and the antenna 83. The Faraday shield 95 is formed of a metal plate as a conductive plate-shaped body and is grounded. Slits 97 are formed in a bottom surface of the Faraday shield 95 in order to prevent an electric field component among electric fields and magnetic fields (electromagnetic fields) generated in the antenna 83 from moving toward the wafers W and to enable the magnetic fields to reach the wafers W. The slits 97 are formed so as to extend in a direction orthogonal to the winding direction of the antenna 83 and are disposed below the antenna 83 over the circumferential direction along a longitudinal direction of the antenna 83. A portion existing inside the winding region of the antenna 83 in the Faraday shield 95 is opened so that a lower side of the Faraday shield 95 is exposed. An insulation plate 94 made of, for example, quartz, is interposed between the Faraday shield 95 and the antenna 83 in order to insulate the region between the Faraday shield 95 and the antenna 83.

As can be seen from FIGS. 2 and 3, when viewed the region surrounded by the antenna 83 from the top, the housing 90, the insulation plate 94 and the Faraday shield 95 are interposed between the wafer W accommodated within the vacuum container 1 and a position spaced apart upward from the vacuum container 1. As described above, the housing 90 and the insulation plate 94 are made of transparent quartz and the opening is formed in the Faraday shield 95 corresponding to the aforementioned region. Thus, the interior of the vacuum container 1 including the plasma generation region can be observed with human eyes from the outside of the vacuum container 1 through the aforementioned region. Since the antenna 83 is disposed so as to surround the aforementioned region, the emission state of plasma within the vacuum container 1 can be monitored from the outside of the vacuum container 1 through the aforementioned region. That is to say, the aforementioned region serves as a transmission window 300 by which the emission state of plasma within the vacuum container 1 is monitored.

As illustrated in FIGS. 1 to 3, one end of an optical fiber 302 is positioned above the transmission window 300 (specifically, above the aforementioned cover member 87). The other end of the optical fiber 302 is connected to a light detection part 301 configured to detect a level of white color of plasma within the vacuum container 1. That is to say, since a high-temperature film forming process is performed within the vacuum container 1, the light detection part 301 is disposed in a position spaced apart upward from the vacuum container 1 using the optical fiber 302 in order to suppress a thermal degradation of the light detection part 301. The one end of the optical fiber 302 constitutes a detection end 303 of the light detection part 301.

The light detection part 301 is configured to measure an emission intensity of a wavelength of each of R (red component), G (green component) and B (blue component) which are light color components in a visible wavelength region. Specifically, the light detection part 301 can disperse a detected light into light components of three colors (i.e., a red color, a green color and a blue color) using, for example, a spectroscope, and can detect amounts (emission intensities) of the respective dispersed light components as light receiving currents using a light receiving sensor. In some embodiments, instead of using the spectroscope, filter parts which selectively transmit a red light component, a green light component and a blue light component may be used so that the light components transmitted through the filter parts can be detected by a light receiving sensor. The intensities of the light components of R, G and B detected by the light detection part 301 are sent to a controller 200.

Figure 5:
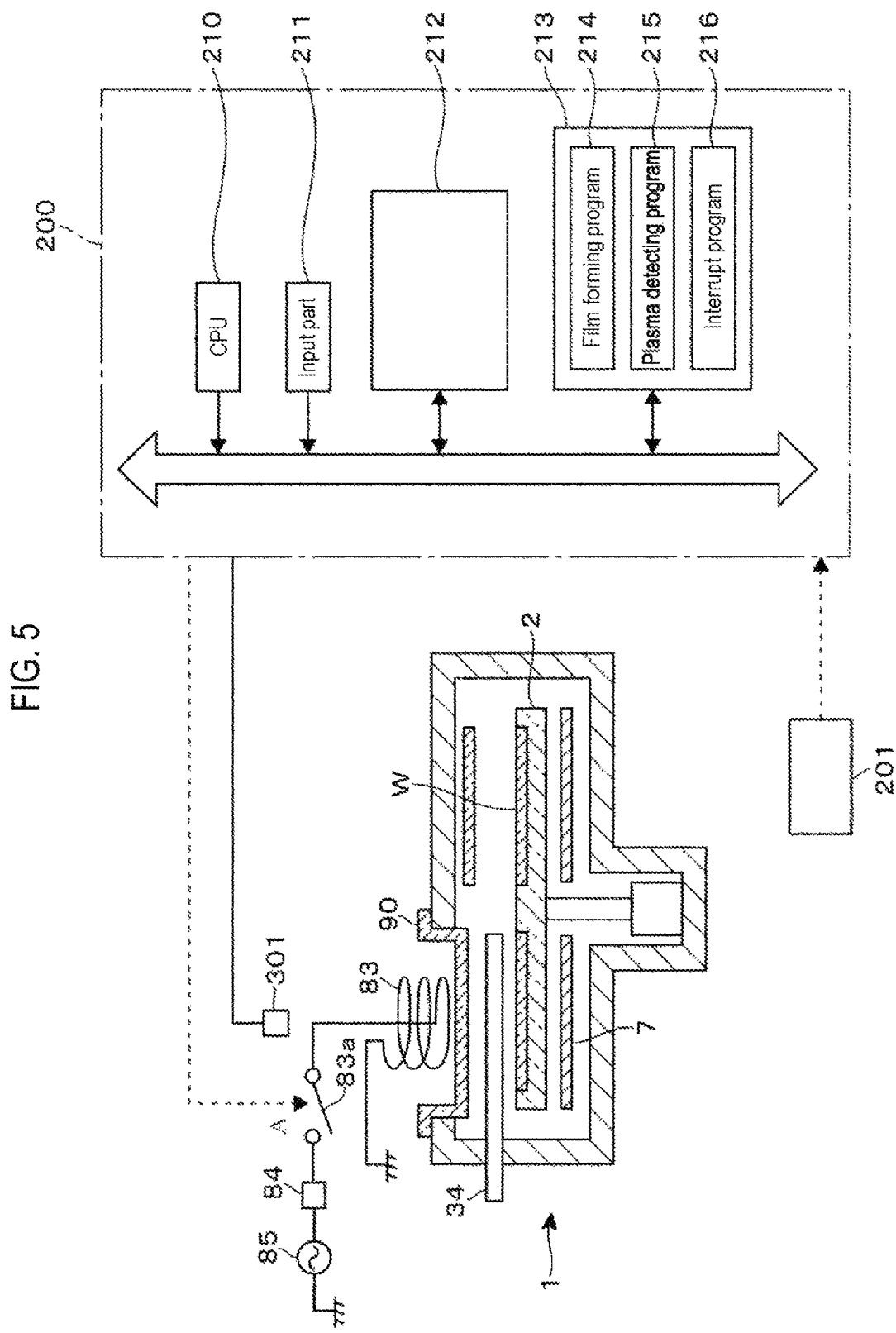
FIG. 5 is a configuration diagram illustrating a control part of the plasma processing apparatus and peripheral devices of a vacuum container.

The controller 200 is composed of a computer which controls the overall operation of the apparatus. As illustrated in FIG. 5, the controller 200 includes a central processing unit (CPU) 210, an input part 211, a memory 212 and a program 213. The input part 211 is used to input different parameters including a threshold value which will be described later. The memory 212 is used to store the threshold value inputted to the input part 211. The program 213 is composed of a film forming program 214, a plasma detecting program 215 and an interrupt program 216.

The film forming program 214 is a program according to which a below-described thin film is formed on the surface of the wafer W by injecting individual gases from the respective nozzles 31, 32, 34, 41 and 42 and supplying the electric power to the antenna 83. The plasma detecting program 215 is used to detect whether or not plasma is ignited based on the detection result obtained at the light detection part 301 and the threshold value stored in the memory 212 as described above.

The interrupt program 216 is used to instruct a subsequent process to the apparatus based on the detection result in the plasma detecting program 215. Specifically, the interrupt program 216 is configured to output a control signal so that the film forming process (the supply of the first process gas) is started when plasma is ignited and so that the stop of the film forming process or the re-ignition of plasma is performed in a below-described manner when plasma is not ignited. The interrupt program 216 will be described below together with the overall operation of the apparatus.

The program 213 described above is installed in the controller 200 from a storage part 201 which is a recoding medium such as a hard disc, a compact disc, a magneto-optical disc, a memory card, a flexible disc or the like.

Figure 6A:
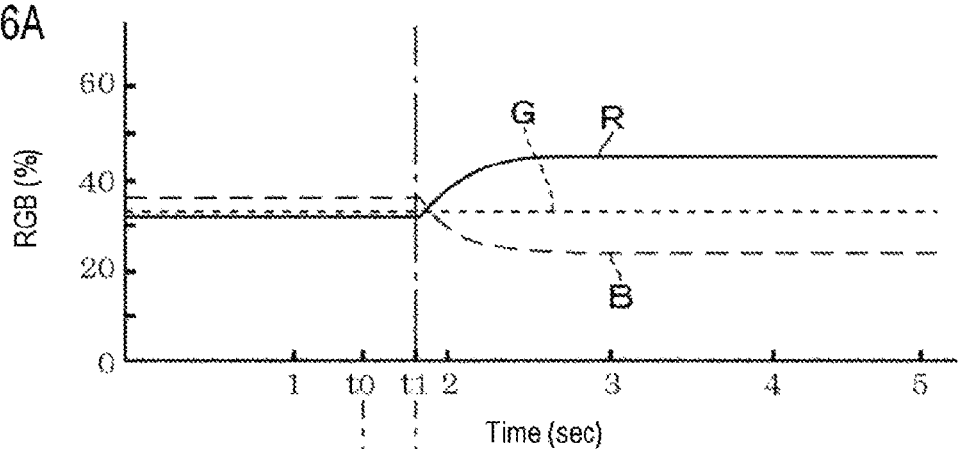
FIGS. 6A, 6B and 6C are graphs showing emission intensities of R, G and B, evaluation values and supplied electric powers as a function of time, before and after supplying an electric power to an antenna.

Descriptions will now be made on a relationship between the detection result obtained at the light detection part 301 and the determination of the ignition or non-ignition of plasma. The aforementioned heater unit 7 configured to emit light according to generation of heat is installed within the vacuum container 1. The rotary table 2 is made of the transparent quartz. Thus, the light emitted from the heater unit 7 passes through the rotary table 2 and the plasma generation region remains bright before the generation of plasma. FIG. 6A shows a change in percentages of the emission intensities of R, G and B (percentages of the respective emission intensities with respect to the sum of the emission intensities of R, G and B) as a function of time. A time t0 is a time point at which a high-frequency power is supplied to the antenna 83 by turning on the switch part 83a illustrated in FIG. 5, namely a time point at which a command for supplying electric power to the antenna 83 is outputted from the controller 200.

After the high-frequency power is supplied to the antenna 83, the ignition of plasma is generated with a small time delay. Thus, time t1 at which the ignition of plasma is generated is slightly later than time t0. In an example illustrated in FIG. 6A, the percentages of the respective emission intensities after time t1 are indicated under a plasma-ignited state. FIG. 6C shows a change in the high-frequency power supplied to the antenna 83 as a function of time. In the following descriptions, for the sake of avoiding complexity of the descriptions, the emission intensities of R, G and B are sometimes simply referred to as R, G and B.

As can be noted from FIG. 6A, the percentage of R becomes larger and the percentage of B becomes smaller with time t1 as a boundary. The percentage of G slightly decreases. Thus, speaking briefly, the ignition or non-ignition of plasma can be determined by monitoring a value corresponding to the change amount before and after time t0 with respect to at least one of the percentages of R, G and B. For example, in the controller 200, with respect to at least one of the percentages of R, G and B, a value (percentage) before time t0 at which the high-frequency power is supplied to the antenna 83 is stored as a reference value and a percentage of emission intensity corresponding thereto is found after time t0, for example, after a predetermined period of time. In this way, the controller 200 monitors a value corresponding to a change amount which is a difference between the found percentage and the reference value. This makes it possible to determine whether the ignition of plasma is generated at a time point at which the predetermined period of time is elapsed from, for example, time t0.

In this example, the change amounts of the percentages of R and B are larger than that of the percentage of G. Therefore, the change amount (the value corresponding to the change amount) of one of R and B before and after time t0 may be used as an evaluation value. If the change amount (more specifically, the absolute value of the change amount) is larger than a predetermined threshold value, it can be determined that the plasma is ignited.

In some embodiments, instead of using the value of the change amount per se of the percentage of one of R, G and B as the evaluation value, the change rate of the percentages of R, G and B, which is the value corresponding to the change amount of the percentages of R, G and B, may be used as the evaluation value. The value used as the evaluation value may be a combination of two or three of the values corresponding to the respective change amounts of R, G and B (the values of the change amounts per se or values including the change rates). In the embodiment of the present disclosure, the following value is used as the evaluation value.

$$\text{Evaluation value} = (\text{change rate of percentage of } R)^2 + (\text{change rate of percentage of } G)^2 + (\text{change rate of percentage of } B)^2 \quad \text{Equation (1)}$$

wherein, change rate of percentage of R=(percentage of R before t0−percentage of R after t0)$^2$÷percentage of R before t0, change rate of percentage of G=(percentage of G before t0−percentage of G after t0)$^2$÷percentage of G before t0, and change rate of percentage of B=(percentage of B before t0−percentage of B after t0)$^2$÷percentage of B before t0.

Figure 6B:
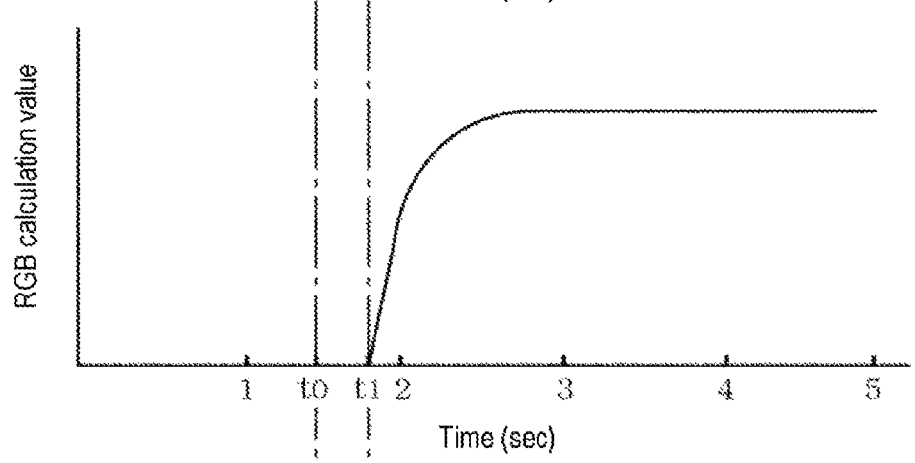
Figure 6C:
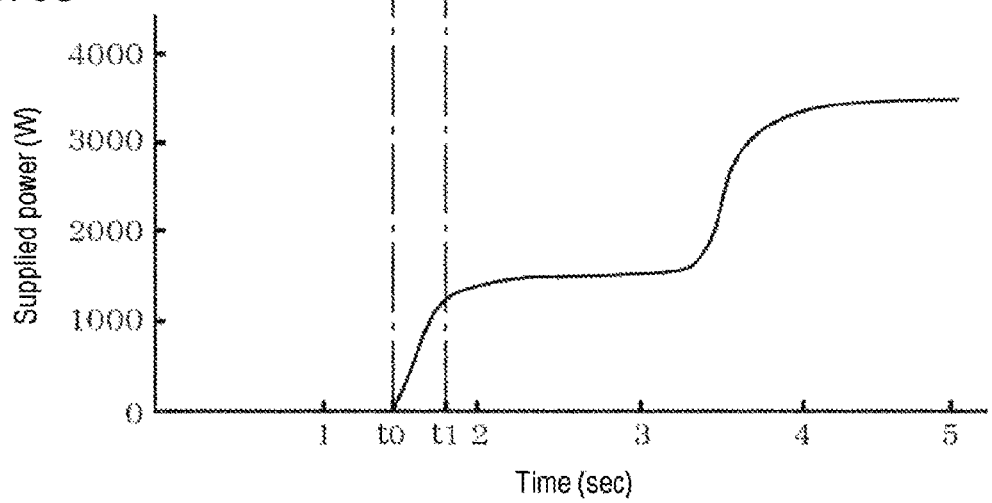

FIG. 6B shows a change before and after t0 of the evaluation value calculated using Equation (1), when the ignition of plasma is performed after time t1. In order to determine the ignition or non-ignition of plasma using the evaluation value, a threshold value serving as a determination criterion is previously set. This threshold value may be decided by, for example, previously performing the generation of plasma multiple times and evaluating the generation of plasma based on the change rates of the percentages of R, G and B obtained at the time of the ignition of plasma. The plasma detecting program 215 includes a step group which finds an evaluation value by performing the calculation of Equation (1), compares the evaluation value with the threshold value, determines the plasma to have been ignited if the evaluation value exceeds the threshold value, and determines plasma not to have been ignited if the evaluation value does not exceed the threshold value.

More specifically, the step group is organized so that if the evaluation value is equal to or smaller than the threshold value when the predetermined period of time is elapsed from time t0 at which the high-frequency power is supplied to the antenna 83, the step group determines that plasma has not been ignited. The step group includes, for example, a step of, as a result of the determination, trying to ignite plasma again (which will be described later) and a step of outputting an alarm after the first ignition is failed or after the second ignition is failed. Accordingly, the plasma detecting program 215 corresponds to a calculation part which calculates the evaluation value and an ignition determination part which determines the ignition or non-ignition of plasma.

In the above embodiment, the determination of ignition of plasma has been described to be performed based on the percentages of R, G and B, but may be performed based on the change amounts of the values per se of the respective emission intensities of R, G and B or the change rates of the values per se of the respective emission intensities. That is to say, the present disclosure may be said to be a technique that uses, as the evaluation value, the values corresponding to the change amounts of R, G and B (values corresponding to the change amounts of the emission intensities per se of R, G and B, or values corresponding to the change amounts of the percentages of the emission intensities).

Next, the operation of the aforementioned embodiment will be described. First, the gate valve G illustrated in FIGS. 1 and 2 is opened. While intermittently rotating the rotary table 2, for example, five wafers W are mounted on the rotary table 2 through the transfer port 15 by a transfer arm (not shown). Subsequently, the gate valve G is closed and the interior of the vacuum container 1 is kept in a vacuum state by the vacuum pump 64. Then, the rotary table 2 is rotated at the number of revolutions according to the process recipe. Gases are supplied into the vacuum container 1 from the second process gas nozzle 32 and the plasma generation gas nozzle 34 without supplying the electric power to the antenna 83, namely without allowing the process gas to become plasma. Furthermore, a nitrogen gas is discharged at a predetermined flow rate from the separation gas nozzles 41 and 42, the separation gas supply pipe 51 and the purge gas supply pipes 72 and 73.

Figure 7:
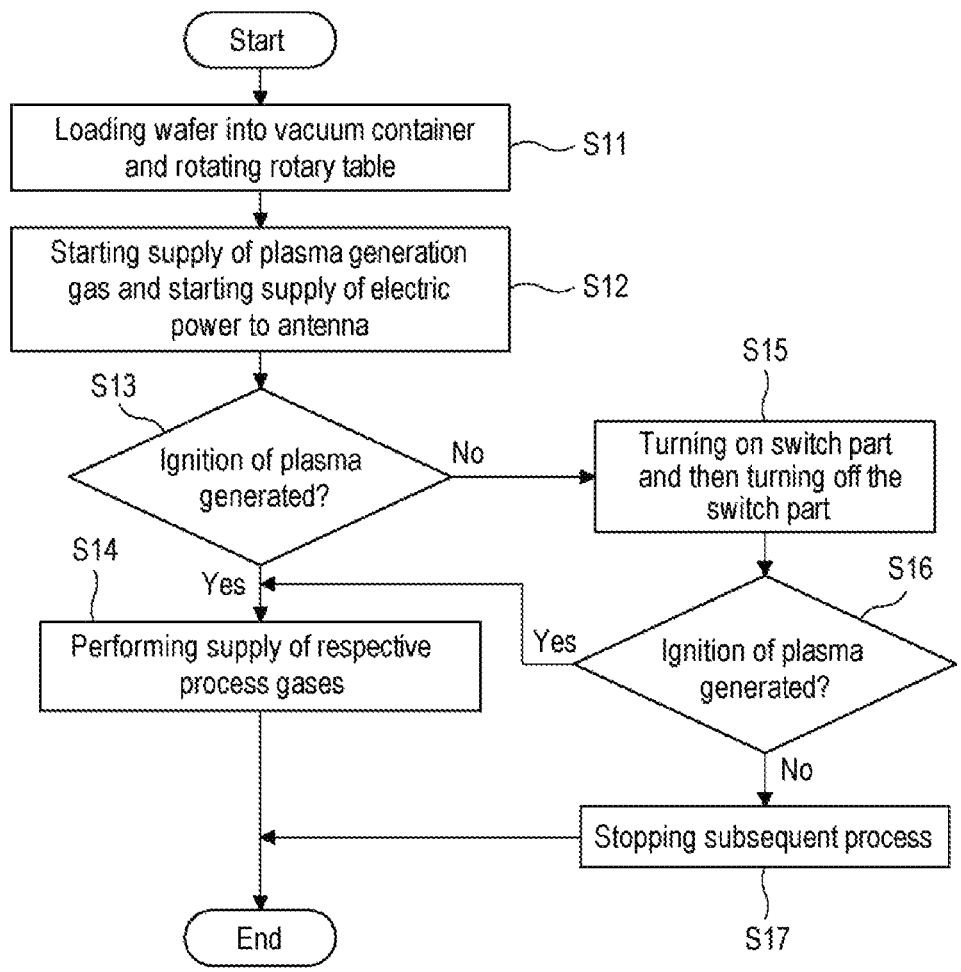
FIG. 7 is a flowchart illustrating a sequence of plasma processing performed in the plasma processing apparatus.
Figure 8:
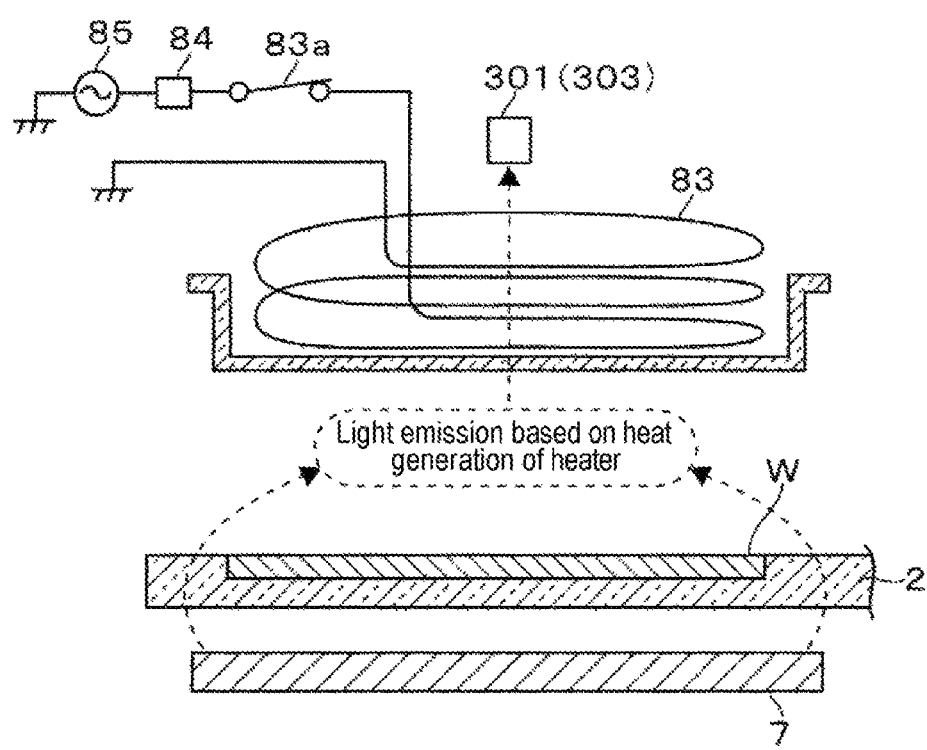
FIG. 8 is a schematic diagram illustrating a state in which a light detection part detects light radiated from a heater in a plasma generation region.

Subsequently, the generation of plasma is started after the heating temperature of the wafer W heated by the heater unit 7 is stabilized at a film formation temperature. Specifically, as illustrated in FIG. 6C, the switch part 83*a* is turned on at time t0, thereby starting the supply of the electric power to the antenna 83. The operations performed thus far correspond to step S1 and step S2 in the flowchart illustrated in FIG. 7. Plasma is not generated immediately after the switch part 83*a* is turned on. Accordingly, as illustrated in FIG. 8, weak emission relying on the heat generation of the heater unit 7 is detected by the light detection part 301. At this time point, the supply of the first process gas is not started.

Subsequently, the ignition or non-ignition of plasma is determined in the following manner (step S13). The controller 200 finds the percentages of the respective light intensities of R, G and B from a time point that precedes time t0 at which the switch part 83*a* is turned on. These values are stored in the memory 212 as reference values. The ignition of plasma is initiated some time after starting the supply of the electric power to the antenna 83. Thus, by expecting this time delay, the respective light intensities of R, G and B are sampled at predetermined sampling intervals from a time (for example, time t1 illustrated in FIG. 6B) delayed by a predetermined period of time from time t0, thereby finding the percentages of the respective light intensities. Then, the evaluation value expressed by Equation (1) is obtained and is compared with a threshold value. If the evaluation value does not exceed the threshold value over a period of time from time t0 to a pre-elapsed time point, it is determined that the ignition of plasma is not generated. The term "pre-elapsed time point" used herein is determined in view of a time obtained by adding a little margin to the time point at which plasma is normally ignited.

Figure 9:
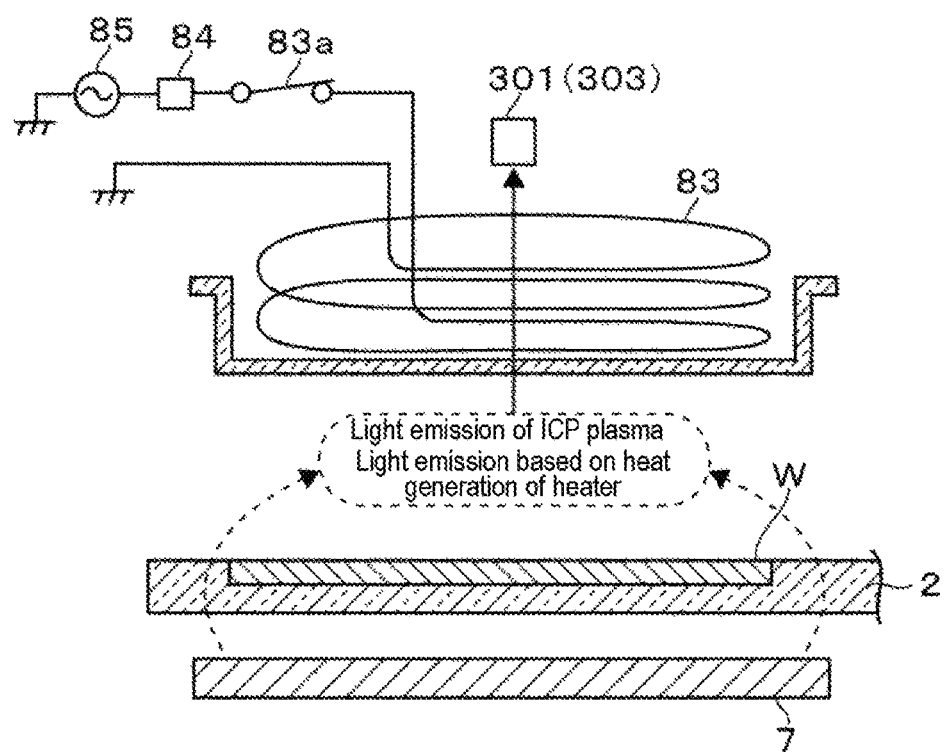
FIG. 9 is a schematic diagram illustrating a state in which the light detection part detects the light radiated from the heater and an emission of plasma in the plasma generation region.

If it is determined that the ignition of plasma is generated (plasma is generated), the supply of the first process gas is started (step S14). FIG. 9 schematically illustrates a state in which plasma is generated and the light of plasma and the light of the heater unit 7 are detected by the light detection part 301. In the first processing region P1, the components of the first process gas are adsorbed onto the surfaces of the respective wafers W mounted on the rotary table 2. In the second processing region P2, the components of the first process gas are oxidized to produce a reaction product. In the third processing region P3, the reaction product existing on the wafers W is modified by plasma. Specifically, impurities contained in the reaction product are removed or a densification of the reaction product is performed. In this way, the respective wafers W sequentially pass through the processing regions P1 to P3 so that the reaction product is laminated to form a thin film.

On the other hand, if it is determined that the ignition of plasma is not generated before supplying the first process gas, a re-ignition work of plasma is performed (step S15). Specifically, the supply of the electric power to the antenna 83 is stopped by the switch part 83*a*. Then, the supply of the electric power to the antenna 83 is resumed. If the ignition of plasma is generated by this re-ignition work (step S16), the film forming process is started in a similar manner. On the other hand, if the ignition of plasma is not generated as yet, a subsequent process is stopped (step S17). That is to say, the supply of the electric power to the antenna 83 is stopped and the supply of the respective gases and the supply of the electric power to the heater unit 7 are stopped. Thereafter, for example, the replacement of the antenna 83 or the like is performed for maintenance.

Figure 10A:
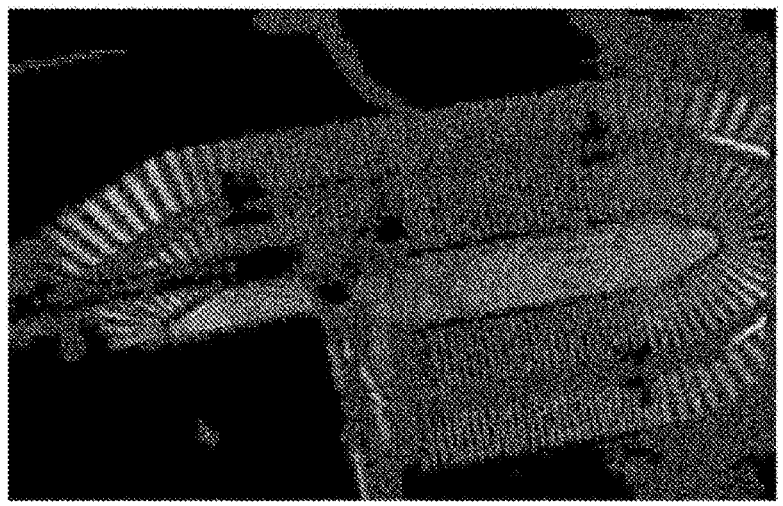
FIGS. 10A and 10B are views illustrating the plasma generation region imaged before and after generation of plasma.
Figure 10B:
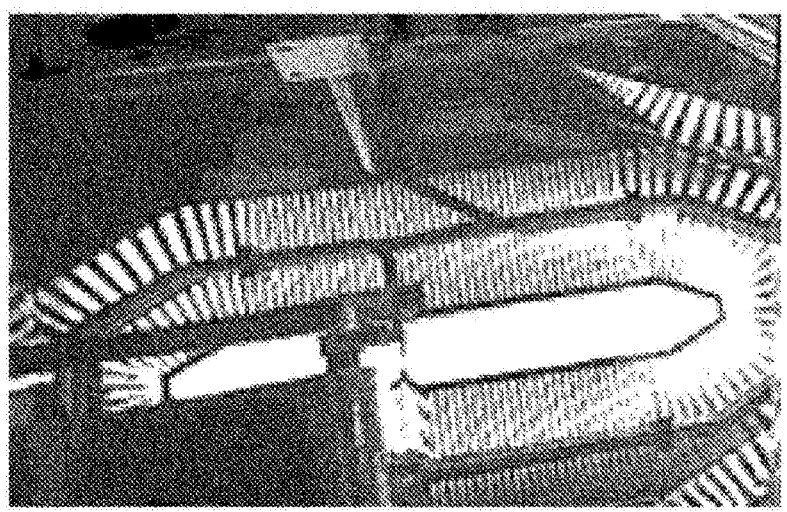

FIGS. 10A and 10B are photographs obtained by imaging the interior of the vacuum container 1 from the side of the transmission window 300 in a state where the rotary table 2 is heated to 400 degrees C. FIG. 10A shows a state in which plasma is not generated, and FIG. 10B shows a state in which plasma is generated.

In the above embodiment, the apparatus which performs the plasma process on the wafers W while revolving the wafers W with the rotary table 2 detects the respective light intensities of R, G and B in the plasma generation region. Then, the apparatus obtains the percentages of R, G and B with respect to the sum of the respective light intensities, obtains the change rates of the respective percentages before and after supplying the high-frequency power to the antenna. The apparatus uses the sum value of the change rates as the evaluation value. The apparatus determines whether or not plasma is ignited according to the comparison result of the evaluation value and the threshold value. Although the plasma generation region is brightened by the light of the heater unit 7, the ignition or non-ignition of plasma can be reliably determined by using the evaluation value. It is therefore possible to prevent a process from being performed in a state where the ignition of plasma is not generated. This makes it possible to prevent generation of a wasted time.

In some embodiments, instead of the sensor equipped with the spectroscope, an image-pickup-purpose CCD camera equipped with a spectroscope, a photodiode and a current detection part may be used as the light detection part 301. Even in this case, a red color, a green color and a blue color are split based on an image picked up by the CCD camera. Emission intensities of the respective colors are also measured.

While in the above embodiment, the antenna 83 has been described to be used in plasma-modifying the reaction product formed on the wafers W, the antenna 83 may be used in plasmalizing the second process gas. In this case, the second process gas is injected from the plasma generation gas nozzle 34. The components of the first process gas adsorbed onto the wafers W are reacted (oxidized) by plasma obtained by converting the second process gas to plasma, thereby forming a reaction product. In some embodiments, the antenna 83 may be used in performing a plasma modifying process with respect to the wafers W on which a reaction product has been already formed by another film forming apparatus.

Further, FIG. 11 is a flowchart illustrating another sequence of plasma processing performed in the plasma processing apparatus.

After the supply of the first process gas is started (step S14), the ignition or non-ignition of plasma is determined again (in step S21). If the result of the determination is YES (e.g., the ignition of plasma is generated), the process goes to step S22 of determining whether the number of revolutions of the rotary table 2 reaches a set number of revolutions. If the number of revolutions of the rotary table 2 is determined to have not yet reached the set number of revolutions, the process returns to step S21 where the determination of the ignition or non-ignition of plasma is repeated. Meanwhile, if the number of revolutions of the rotary table 2 is determined to have reached the set number of revolutions, the process is terminated. Because it is difficult to form a good film if a time interval of such a modifying process is not properly set in modifying the surface of each of the wafers W, these steps are provided to mitigate such difficulty.

On the other hand, if the result of the determination in step S21 is NO (e.g., the ignition of the plasma is not generated), the process is terminated (in step S23). In this way, a period of time during which the surface of the wafer is exposed to plasma is controlled, which makes it possible to adjust a modification effect.

The present disclosure is directed to an apparatus of performing a plasma process on substrates while revolving the substrates with a rotary table, in which a plasma generation region is brightened by light of a heater disposed under the rotary table. The apparatus obtains an evaluation value corresponding to a change amount before and after supplying a high-frequency power to a plasma-generating antenna with respect to at least one of light intensities of light color components, i.e., an R component, a G component and a B component, in the plasma generation region, and determines whether or not plasma is ignited based on a comparison result of the evaluation value and a threshold value. It is therefore possible to reliably determine the ignition or non-ignition of plasma.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus of performing a plasma process with respect to substrates which are mounted on an upper surface of a rotary table installed within a vacuum container, while rotating the rotary table and consequently revolving the substrates, the apparatus comprising:
   a heater installed under the rotary table and configured to heat the substrates;
   a process gas supply part configured to supply a process gas toward the upper surface of the rotary table;
   an antenna configured to generate an inductively coupled plasma by converting the process gas to plasma;
   a light detection part configured to detect respective light intensities of an R component, a G component and a B component as light color components in a plasma generation region;
   a calculation part configured to obtain an evaluation value corresponding to a change amount before and after supplying a high-frequency power to the antenna, with respect to at least one of the respective light intensities of the R component, the G component and the B component detected by the light detection part; and
   an ignition determination part configured to compare the evaluation value obtained at the calculation part with a threshold value and to determine that ignition of plasma is not generated if the evaluation value does not exceed the threshold value,
   wherein the rotary table is made of a material which transmits light generated by the heater.

2. The apparatus of claim 1, wherein the evaluation value is a value corresponding to a change amount of a percentage of at least one of the respective light intensities of the R component, the G component and the B component.

3. The apparatus of claim 2, wherein the value corresponding to the change amount of the percentage of at least one of the respective light intensities is a value corresponding to a change rate of the percentage of at least one of the respective light intensities.

4. The apparatus of claim 1, wherein a Faraday shield is installed between the antenna and the plasma generation region, and the light detection part is installed to detect light in the plasma generation region through an opening portion of the Faraday shield.

5. The apparatus of claim 1, further comprising:
a control part configured to output a control signal so that when it is determined by the ignition determination part that the ignition of plasma is not generated, the supply of the high-frequency power to the antenna is first stopped and then the supply of the high-frequency power to the antenna is resumed.

6. A plasma processing method, comprising:
mounting substrates on an upper surface of a rotary table installed within a vacuum container and revolving the substrates by rotating the rotary table;
heating the substrates by a heater installed under the rotary table;
supplying a process gas toward one surface of the rotary table;
supplying a high-frequency power to an antenna in order to generate an inductively coupled plasma by converting the process gas to plasma;
detecting respective light intensities of an R component, a G component and a B component as light color components in a plasma generation region;
obtaining an evaluation value corresponding to a change amount before and after the supply of the high-frequency power to the antenna, with respect to at least one of the detected respective light intensities of the R component, the G component and the B component; and
comparing the obtained evaluation value with a threshold value and determining that ignition of plasma is not generated if the evaluation value does not exceed the threshold value,
wherein the rotary table is made of a material which transmits light generated by the heater.

7. A non-transitory computer-readable recording medium storing a computer program used in a plasma processing apparatus of performing a plasma process with respect to substrates which are mounted on an upper surface of a rotary table installed within a vacuum container while rotating the rotary table and consequently revolving the substrates, the computer program including instructions organized to perform the plasma processing method of claim 6.

* * * * *